(12) United States Patent
Kim et al.

(10) Patent No.: US 7,460,205 B2
(45) Date of Patent: Dec. 2, 2008

(54) METHOD FOR CUTTING LIQUID CRYSTAL DISPLAY PANEL AND METHOD FOR FABRICATING LIQUID CRYSTAL DISPLAY PANEL USING THE SAME

(75) Inventors: Je Hyun Kim, Gyeongsangnam-Do (KR); Hyung Jin Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 333 days.

(21) Appl. No.: 11/477,793

(22) Filed: Jun. 30, 2006

(65) Prior Publication Data

US 2007/0153455 A1    Jul. 5, 2007

(30) Foreign Application Priority Data

Dec. 29, 2005    (KR)    ............... 10-2005-0134394

(51) Int. Cl.
G02F 1/13    (2006.01)
(52) U.S. Cl. .................... 349/187; 349/190
(58) Field of Classification Search ........ 349/187, 349/190, 191, 123, 126, 104, 106
See application file for complete search history.

(56) References Cited

U.S. PATENT DOCUMENTS

| | | | |
|---|---|---|---|
| 6,653,210 B2 * | 11/2003 | Choo et al. ............... | 438/460 |
| 7,295,279 B2 * | 11/2007 | Byun et al. ............... | 349/187 |
| 2002/0170896 A1 * | 11/2002 | Choo et al. ............ | 219/121.72 |
| 2004/0056008 A1 * | 3/2004 | Choo et al. ............ | 219/121.69 |
| 2007/0153218 A1 * | 7/2007 | Kim et al. ............... | 349/187 |
| 2007/0153221 A1 * | 7/2007 | Yoo et al. ............... | 349/187 |
| 2008/0002137 A1 * | 1/2008 | Kim et al. ............... | 349/187 |

* cited by examiner

*Primary Examiner*—Brian M Healy
(74) *Attorney, Agent, or Firm*—McKenna Long & Aldridge LLP

(57) ABSTRACT

A method for cutting a liquid crystal display panel includes transferring a pair of attached mother substrates having a plurality of panel regions arranged thereon to a first scribing part; forming first prearranged cut lines for sectioning the panel regions in a first direction on front and rear surfaces of the mother substrates through a first scribing unit having a plurality pairs of first heads; forming second prearranged cut lines for sectioning the panel regions in a second direction on the front and rear surfaces of the mother substrates through a second scribing unit having a plurality pairs of second heads; and transferring the mother substrates with the first and second prearranged first and second cut lines formed thereon to a breaking part and separating them into a plurality of unit liquid crystal display panels.

35 Claims, 7 Drawing Sheets

METHOD FOR CUTTING LIQUID CRYSTAL DISPLAY PANEL AND METHOD FOR FABRICATING LIQUID CRYSTAL DISPLAY PANEL USING THE SAME

This application claims the benefit of the Korean Patent Application No. 2005-134394, filed on Dec. 29, 2005, which is hereby incorporated by reference for all purposes as if fully set forth herein. This application incorporates by reference co-pending application Ser. No. 10/184,096, filed on Jun. 28, 2002 now U.S. Pat. No. 7,295,279 entitled "SYSTEM AND METHOD FOR MANUFACTURING LIQUID CRYSTAL DISPLAY DEVICES FROM LARGE MOTHER SUBSTRATE PANELS" and co-pending application Ser. No. 11/476,919, filed on Jun. 29, 2006, entitled "METHODS OF MANUFACTURING LIQUID CRYSTAL DISPLAY DEVICES" for all purposes as if fully set forth herein.

BACKGROUND OF THE INVENTION

1. Field of the Invention

The present invention relates to a method for cutting a liquid crystal display panel and, more particularly, to a method for cutting a plurality of liquid crystal display panels formed on large-scale mother substrates, and a method for fabricating a liquid crystal display panel using the same.

2. Description of the Related Art

As the consumers' interest in information displays grows and the demand for portable (mobile) information devices increases, research and commercialization of light and thin flat panel displays ("FPD") has increased. Flat panel displays may replace the Cathode Ray Tube ("CRT"), which is the most common existing display device.

The liquid crystal display ("LCD") device is a FPD device for displaying images by using optical anisotropy of liquid crystal. LCD devices exhibit excellent resolution and color and picture quality, so it is widely applied for notebook computers or desktop monitors, and the like.

The LCD device will now be described in detail.

The LCD device includes a liquid crystal display panel including a driving circuit unit, a backlight unit installed at a lower portion of the liquid crystal display panel and emitting light to the liquid crystal display panel, a mold frame for supporting the backlight unit and the liquid crystal display panel, and a case, etc.

With reference to FIG. 1, the liquid crystal display panel 10 includes an image display part 13 in which liquid crystal cells are arranged in a matrix form, a gate pad part 14 connected with gate lines 16 of the image display part 13 and a data pad part 15 connected with data lines 17.

The gate pad part 14 and the data pad part 15 are formed at an edge region of a thin film transistor (TFT) array substrate 1 that does not overlap with a color filter substrate 2. The gate pad part 14 supplies scan signals provided from a gate driver (not illustrated) to the gate lines 16 of the image display part 13, and the data pad part 15 supplies image information provided from a data driver (not illustrated) to the data lines 17 of the image display part 13.

Although not illustrated, the color filter substrate 2 includes a color filter including red, green and blue sub-color filters implementing colors, a black matrix for separating the sub-color filters and blocking light from transmitting through a liquid crystal layer, and a transparent common electrode for applying a voltage to the liquid crystal layer.

The array substrate 1 includes a plurality of gate lines 16 and a plurality of data lines 17 arranged vertically and horizontally thereon, respectively, and defining a plurality of pixel regions, the TFT, namely, a switching element, formed at each crossing of the gate lines 16 and the data lines 17, and a pixel electrode formed on each pixel region.

The array substrate 1 and the color filter substrate 2 are attached in a facing manner by a seal pattern 40 formed at an edge of the image display part 13 to form a liquid crystal display panel 10, and the two substrates 1 and 2 are attached through an attachment key (not illustrated) formed on the array substrate 1 or the color filter substrate 2.

In order to improve manufacturing yield, in the LCD device, the TFT array substrates are formed on a large-scale mother substrate, color filter substrates are formed on another separate mother substrate, which are then attached to simultaneously form the plurality of liquid crystal display panels. In this case, for the attached mother substrates, a cutting process is required to cut the attached mother substrates into a plurality of unit liquid crystal display panels.

In general, cutting of the mother substrates is performed such that a prearranged cut groove is formed on the mother substrates with a wheel with high hardness compared with glass and then cracking is made along the prearranged cutting groove.

FIG. 2 is a view illustrating the structure of a section of the unit liquid crystal display panel formed by attaching the first mother substrate on which the TFT array substrates are formed and the second mother substrate on which the color filter substrates are formed.

As illustrated, in the unit liquid crystal panels, the thin film transistor array substrates 1 are protruded at one side compared to the color filter substrates 2, because the gate pad part (not illustrated) and the data pad part (not illustrated) are formed at the edge portion of the thin film transistor array substrate 1 which is not overlapped with the color filter substrate 2.

Accordingly, the color filter substrates 2 formed on the second mother substrate 30 are formed to be separated as long as a first dummy region 31 corresponding to the protruded portion of the thin film transistor array substrates 1 formed on the first mother substrate 20.

The unit liquid crystal panels are suitably disposed such that the first and the second mother substrates 20 and 30 can be utilized to their maximum, and though they differ depending on a model, the unit liquid crystal panels are usually formed to be separated as long as a second dummy region 32.

After the first mother substrate 20 with the thin film transistor array substrates 1 formed thereon and the second mother substrate 30 with the color filter substrates 2 formed thereon are attached, the liquid crystal panels are cut. At this time, the first dummy region 31 formed at the portion where the color filter substrates 2 of the second mother substrate 30 are separated and the second dummy region 32 separating the unit liquid crystal panels are simultaneously removed.

The cutting process of the liquid crystal display panel will be described as follows.

FIG. 3 is an exemplary view illustrating a cutting process of the liquid crystal display panel.

As illustrated, a cutting device of the liquid crystal display panel includes a table 42 on which the first and second mother substrates 20 and 30 for which previous processes have been terminated, are loaded, and a cutting wheel 55 for processing the first and second mother substrates 20 and 30 to form prearranged cut lines 51.

In the cutting device of the liquid crystal display panel, when the first and second mother substrates 20 and 30 including a plurality of liquid crystal display panels and attached in a facing manner are loaded on the table 42, the cutting wheel 55 positioned at an upper side of the first and second mother substrates 20 and 30 is lowered and rotated in a state that certain pressure has been applied to the second mother substrate 30, to thereby form prearranged cut lines 51 in a groove form on the surface of the second mother substrate 30.

The prearranged cut lines are also formed on the first mother substrate 20. Namely, the first mother substrate 20 is processed with the cutting wheel 55 to form prearranged cut liens at the same positions as the prearranged cut lines 51 of the second mother substrate 30. Accordingly, in the liquid crystal panel cutting process, since the first and second mother substrates 20 and 30 are processed to form the prearranged cut lines 51, after the second mother substrate 30 is processed with the cutting wheel 55, the liquid crystal panel is reversed to make the first mother substrate 20 to face upward and then the first mother substrate 20 is processed with the cutting wheel 55.

Thereafter, pressure is applied to the prearranged cut lines 51 formed on the first and second mother substrates 20 and 30 to separate the first and second mother substrates 20 and 30. And then, the first and second mother substrates 20 and 30 are separated such that the first and second mother substrates 20 and 30 are stroke with a breaking bar so that cracking can be made along the prearranged cut lines 51.

In cutting the liquid crystal display panel, a scribing process and a breaking process are performed several times through a plurality number of reversing.

Thus, much time is required for the scribing process and the breaking process to cause a problem of reduction in productivity.

Furthermore, in the cutting method of the liquid crystal display panel, a plurality of glass chips are generated when the mother substrates are struck with a breaking bar to make cracks along the prearranged cut lines formed on the mother substrates. If the glass chips are adsorbed on the mother substrates, the quality of the LCD device would be degraded or the LCD device may not be driven.

BRIEF DESCRIPTION OF THE INVENTION

Therefore, one aspect of the present invention involves the recognition by the present inventors of the drawbacks in the related art as explained above. In order to address such problems, the present invention provides a method for cutting a liquid crystal display panel capable of shortening time required for cutting a liquid crystal display panel, and a method for fabricating a liquid crystal display panel using the same.

Another aspect of the present invention provides a method for cutting a liquid crystal display panel capable of preventing generation of glass chips in cutting a liquid crystal display panel along prearranged cut lines formed on a large-scale mother substrate, and a method for fabricating a liquid crystal display panel using the same.

Still another aspect of the present invention provides a method for cutting a liquid crystal display panel capable of stabilizing performing of cracking by shortening a standby time during which a mother substrate waits at a striking unit, and a method for fabricating a liquid crystal display panel using the same.

One feature of the present invention is to provide a method for cutting a liquid crystal display panel including: transferring a pair of attached mother substrates having a plurality of panel regions arranged thereon to a first scribing part; forming first prearranged cut lines for sectioning the panel regions in a first direction on front and rear surfaces of the mother substrates through a first scribing unit having a plurality pairs of first heads; forming second prearranged cut lines for sectioning the panel regions in a second direction on the front and rear surfaces of the mother substrates through a second scribing unit having a plurality pairs of second heads; and transferring the mother substrates with the first and second prearranged first and second cut lines formed thereon to a breaking part and separating them into a plurality of unit liquid crystal display panels.

Another feature of the present invention is to provide method for fabricating a liquid crystal display panel including: providing mother substrates divided into a plurality of panel regions; performing an array process on the mother substrate for an array substrate and performing a color filter process on the mother substrate for a color filter substrate; forming an alignment film on the surface of the mother substrates; performing rubbing on the alignment film-formed mother substrates; attaching the pair of rubbing-finished mother substrates; forming first prearranged cut lines for sectioning the panel regions in a first direction on front and rear surfaces of the attached mother substrates by using a first scribe unit having a plurality pairs of first heads; forming second prearranged cut lines for sectioning the panel regions in a second direction on the front and rear surfaces of the mother substrates through a second scribing unit having a plurality pairs of second heads; and separating the mother substrates with the first and second prearranged first and second cut lines formed thereon into a plurality of unit liquid crystal display panels.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

A method for cutting a liquid crystal display panel and a method for fabricating a liquid crystal display panel using the same according to the present invention will be described with reference to the accompanying drawings.

Figure 1:
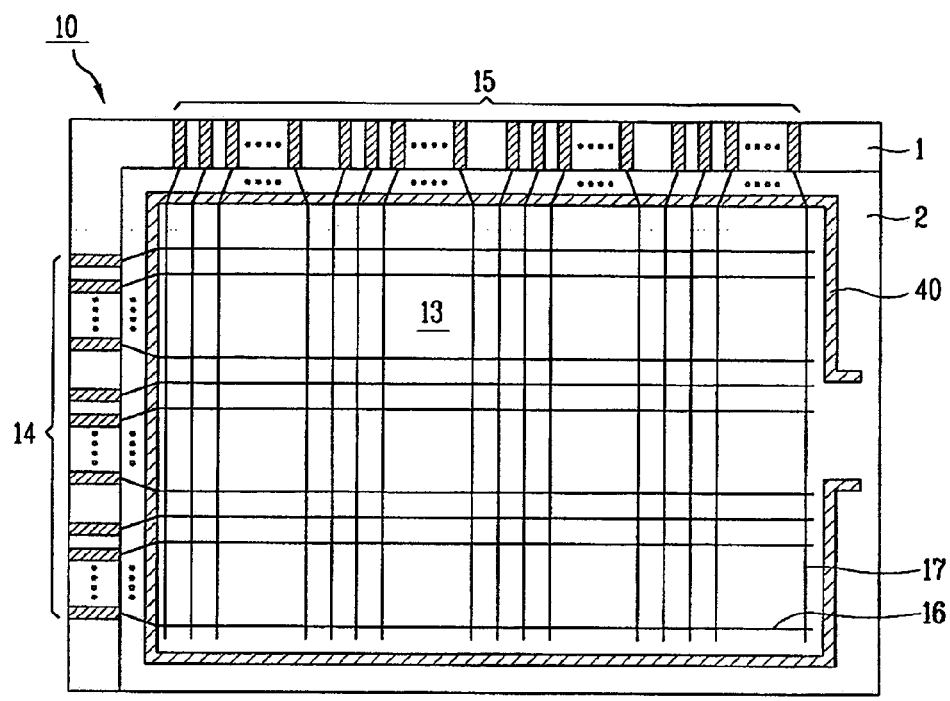
FIG. 1 is an exemplary view illustrating a plane structure of a unit liquid crystal display panel formed by attaching a thin film transistor (TFT) array substrate and a color filter substrate in a facing manner.
Figure 2:
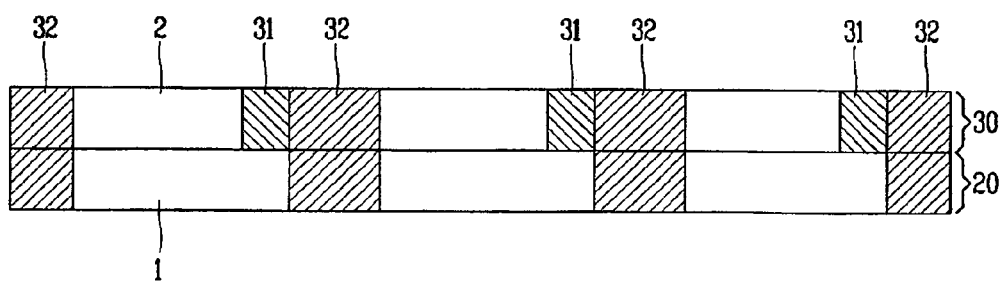
FIG. 2 is a view illustrating the structure of a section of the unit liquid crystal display panel formed by attaching the first mother substrate on which the TFT array substrates are formed and the second mother substrate on which the color filter substrates are formed.
Figure 3:
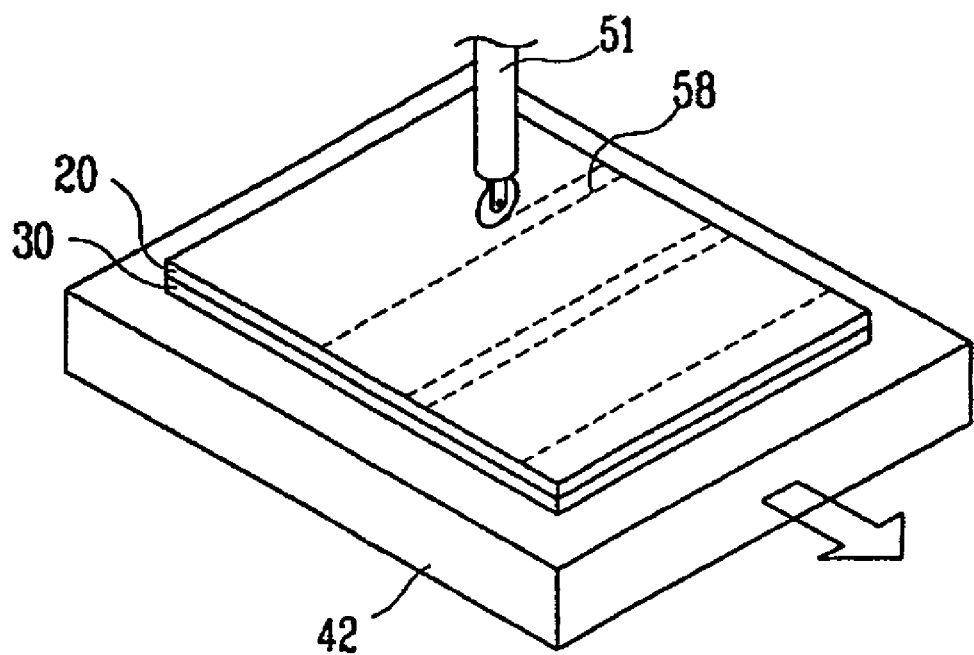
FIG. 3 is an exemplary view illustrating a cutting process of a liquid crystal display panel.
Figure 4:
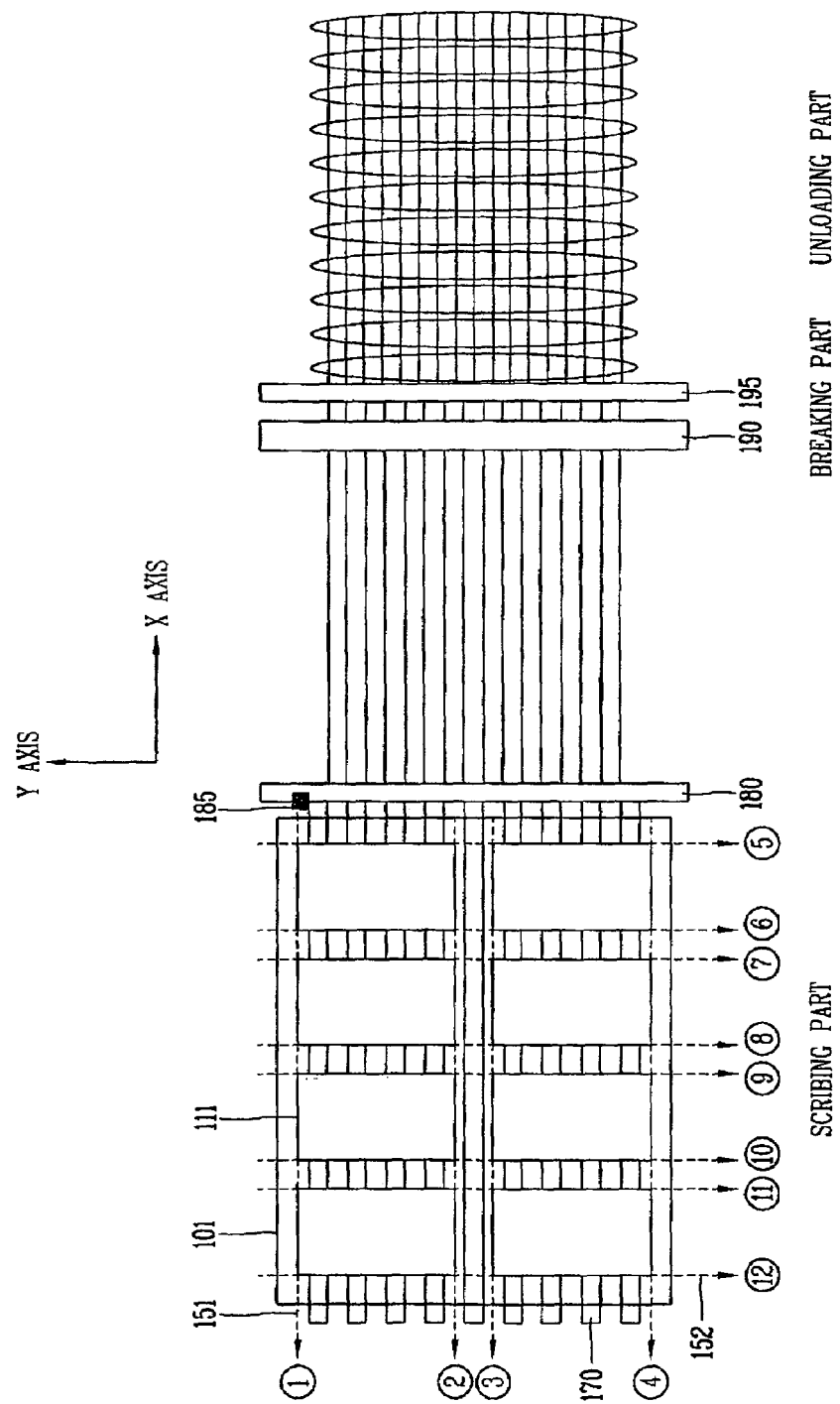
FIG. 4 is an exemplary view illustrating a cutting process of a liquid crystal display panel in accordance with a first embodiment of the present invention.

FIG. 4 is an exemplary view illustrating a cutting process of a liquid crystal display panel in accordance with a first embodiment of the present invention.

As illustrated in FIG. 4, a pair of attached mother substrates 101 on which a plurality of panel regions 111 have been arranged are transferred to a scribing part through a transfer unit in order to be divided into individual unit liquid crystal display panels along the panel regions 111.

The panel regions 111 can be an array substrate on which thin film transistors (TFTs) have been formed through an array process, and the lower panel regions 111 can be a color filter substrate on which color filters have been formed through a color filter process. In this embodiment of the present invention, the panel regions have the same size, but the present invention is not limited in this way, and contemplates embodiments in which the panel regions 111 can be formed with two or more different sizes.

In the drawing, the transfer unit includes a plurality of conveyer belts 170, but the present invention is not limited thereto and the transfer unit can include a plurality of transfer rollers. In addition, the transfer unit may include a first conveyor part formed as a conveyer belt and a second conveyor part formed as a transfer roller, which are coupled.

After the mother substrates 101 are transferred to the scribing part, first prearranged cut lines 151 are formed to section the panel regions 111 on the front and rear surfaces of the mother substrates 101 in a first direction through a scribing unit 180.

In the first embodiment of the present invention, the scribing unit 180 driven in an X axis direction includes a pair of heads 185 and repeatedly performs a first scribing process (1-4) four times to form the first prearranged cut lines 151 in the first direction, namely, in the X axis direction on the mother substrates 101 through the heads 185.

After the first scribing process (1-4) in the first direction is finished, the heads 185 of the scribing unit 180 are driven in a Y axis direction to form second prearranged cut lines 152 for sectioning the panel regions 111 on the front and rear surfaces of the mother substrates 101 in a second direction. In this case, in order to form the second prearranged cut lines 152 on the mother substrates 101 through the heads 185, the scribing process (5-12) is repeated eight times in the second direction, namely, in the Y axis direction.

The scribing unit 180 includes the head 185 at the upper and lower portions thereof to form the first and second prearranged cut lines 151 and 152 on the front and rear surfaces of the mother substrates 101, and a scribing wheel (not illustrated) made of a material having higher hardness compared with glass is mounted at each head 185.

After the scribing process in the first and second directions is finished, the mother substrate 101 is moved to the breaking part. In the breaking part, steam is sprayed onto the front and rear surfaces of the mother substrates 101 through a steam break 190 disposed to be substantially perpendicular to the proceeding direction of the mother substrates 101 to make crack along the prearranged cut lines 151 and 152 to thereby separate liquid crystal display panels 110.

Although not illustrated, the steam break 190 includes a body for receiving water through a water supply pipe, a heating unit provided inside the body and heating water supplied through the water supply pipe to generate steam and a spraying unit for spraying steam generated by the heating unit onto the surface of the mother substrates 101.

Steam generated from the spraying unit is sprayed onto the front and rear surfaces of the mother substrates 101 at a temperature of about 100° C.-250° C. thereby expanding the mother substrates 101 made of the glass material according to heat and pressure. In this case, the first and second prearranged cut lines 151 and 152 of the mother substrates 101 are precisely expanded to be cut along, while the mother substrates 101 are being transferred to an unloading part.

Furthermore, an air knife 195 for spraying dried air with a certain pressure is installed at a rear surface of the steam break 190 in order to remove moisture or glass chips remaining on the surface of the mother substrates 101 after the steam is sprayed on the mother substrates 101, and at the same time, proceed with making cracks formed along the first and second prearranged cut lines 151 and 152.

As stated above, according to the method for cutting the liquid crystal display panel in the first embodiment of the present invention, the first prearranged cut lines are simultaneously formed on the front and rear surfaces of the mother substrates and then the scribing heads are driven in the Y axis direction to simultaneously form the second prearranged cut lines on the front and rear surfaces of the mother substrates. Thus, without having to rotate or reverse the mother substrates, the first and second prearranged cut lines can be formed on the front and rear surfaces of the mother substrates.

In addition, steam is simultaneously sprayed on the first and second prearranged cut lines formed on the front and rear surfaces of the mother substrates to make cracks along the first and second prearranged cut lines in order to separate the liquid crystal display panels. This shortens the time required to cut the liquid crystal display panels.

In the method for cutting the liquid crystal display panel in accordance with the first embodiment of the present invention, the single scribing unit includes a pair of heads, so a scribing process is performed a total of twelve times to form the first and second prearranged cut lines on the mother substrates. In comparison, in a method for cutting the liquid crystal display panel in accordance with a second embodiment of the present invention, X axis scribing and Y axis scribing are performed simultaneously in different scribing parts and each scribing unit has a multi-head whereby first and second prearranged cut lines can be formed through a scribing processes performed a total of two times. The method for cutting a liquid crystal display panel in accordance with the second embodiment of the present invention will be described in detail with reference to the accompanying drawings.

Figure 5:
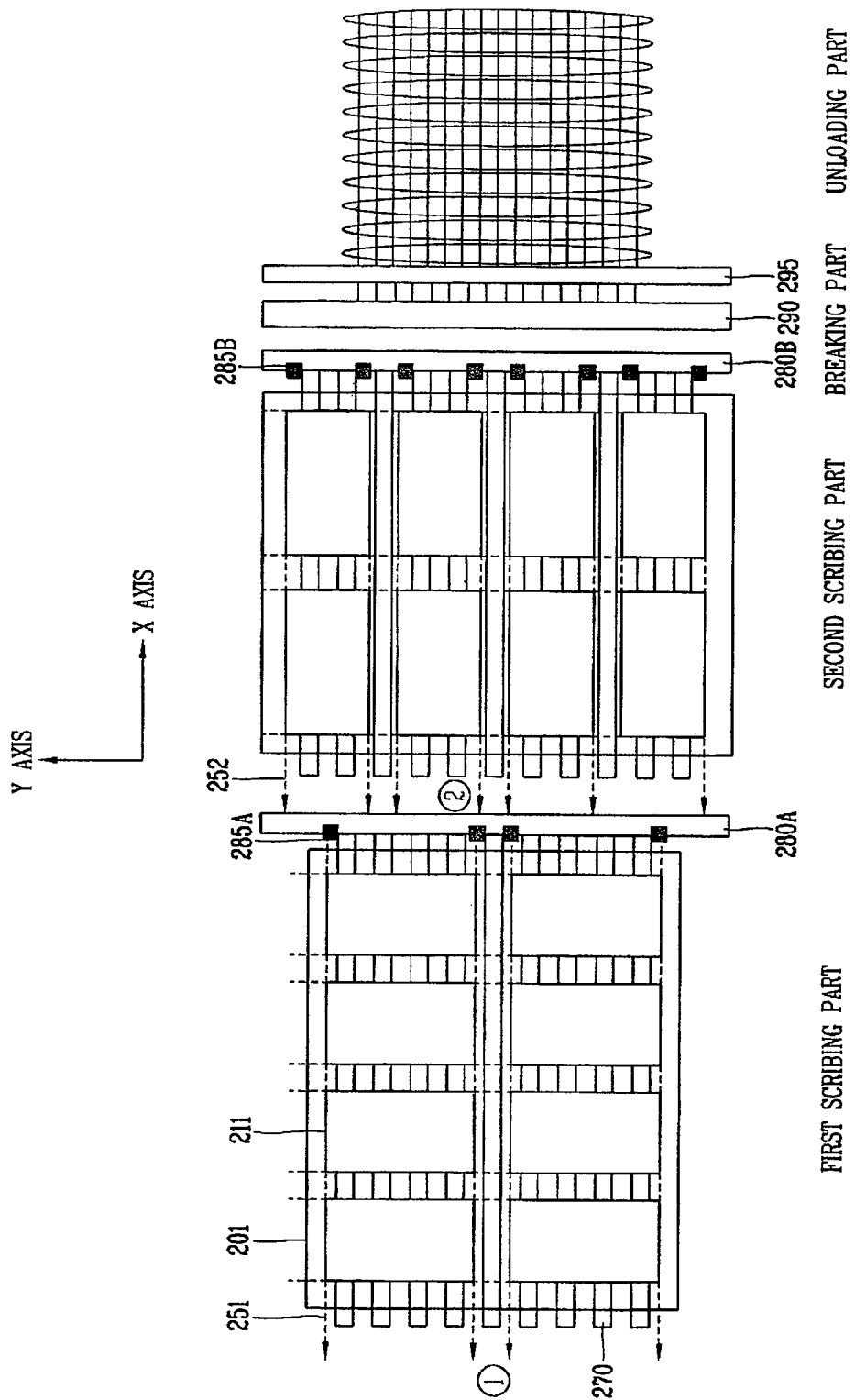
FIG. 5 is an exemplary view illustrating a cutting process of a liquid crystal display panel in accordance with a second embodiment of the present invention.

FIG. 5 is an exemplary view illustrating a cutting process of a liquid crystal display panel in accordance with a second embodiment of the present invention. The process of cutting a liquid crystal display panel in the second embodiment of the present invention is the same as that in the first embodiment of the present invention, except for the scribing parts and a corresponding scribing process.

As illustrated in FIG. 5, the process of cutting a liquid crystal display panel is performed through first and second scribing parts, a breaking part and an unloading part.

First, a pair of attached mother substrates 201 on which a plurality of panel regions 211 have been arranged are transferred to a first scribing part through a transfer unit that includes a plurality of conveyer belts 270 so as to be divided into individual unit liquid crystal display panels along the panel regions 211.

The panel regions 211 can be an array substrate on which thin film transistors (TFTs) have been formed through an array process, and the lower panel regions 211 can be a color filter substrate on which color filters have been formed through a color filter process.

After the mother substrates 201 are transferred to the first scribing part, first prearranged cut lines 251 are formed to section the panel regions 211 on the front and rear surfaces of the mother substrates 201 in a first direction through a first scribing unit 280A.

In this embodiment, the first scribing unit 280A is driven in an X axis direction and includes plurality pairs of heads 285A. Thus, in a first scribing process (1) performed once, first prearranged cut lines 251 are formed in the first direction, namely, in the X axis direction on the mother substrates 201 through the plurality pairs of first heads 285A. In this case, for example, a first scribing unit 280A having four pairs of first heads 285A is illustrated in FIG. 5 for the sake of explanation, but the present invention is not limited thereto.

After the first scribing process in the first direction is finished, the mother substrates 201 are rotated by 90° and transferred to a second scribing part. In this case, the mother substrates 201 themselves can be rotated by 90°, or a stage (not illustrated) on which the mother substrates 201 are loaded can be rotated by 90°.

In the second embodiment of the present invention, in order to perform a second scribing process, the first scribing process (1)—finished mother substrates 201 are rotated by 90° and then transferred to the second scribing part. This is because the transfer unit provided at the second scribing part includes a plurality of conveyer belts 270. If the second scribing part includes a transfer unit including a plurality of transfer rollers, the process of rotating the mother substrates 201 is not required.

Thereafter, second prearranged cut lines 252 are formed to section the panel regions 211 on the front and rear surfaces of the mother substrates 201 in a first direction through the plurality pairs of second heads 285B provided at a second scribing unit 280B. In this case, the second scribing unit 280B is driven in the X axis direction, in the same manner as the first scribing unit 280A and includes the plurality pairs of second heads 285B, so the second prearranged cut lines 252 can be formed in the first direction, namely, in the X axis direction, on the mother substrates 201 through the plurality pairs of second heads 285B through a second scribing process (2) carried out once. In this case, the first and second prearranged cut lines 251 and 252 cross each other substantially.

As mentioned above, if the second scribing part includes a transfer unit including a plurality of transfer rollers, a plurality pairs of second heads driven in a Y axis direction can be provided in the second scribing unit 280B and form the second prearranged cut lines 252 for sectioning the panel regions 211 on the front and rear surfaces of the mother substrates 201 in the second direction, namely, in the Y axis direction.

The scribing units 280A and 280B include the plurality pairs of heads 285A and 285B at upper and lower portions thereof, respectively, to form the first and second prearranged cut lines 251 and 252 on the front and rear surfaces of the mother substrate 201, and a scribing wheel (not illustrated) made of a material with strong hardness compared with glass is mounted in each of the heads 285A and 285B.

After the scribing processes (1 and 2) in the first and second directions are finished, the mother substrates 201 are moved to the breaking part. Steam is sprayed on the front and rear surfaces of the mother substrates 201 through a steam break 290 and an air knife 295 cuts the mother substrates 201 along the prearranged cut lines 251 and 252 to separate the liquid crystal display panels.

As stated above, according to the method for cutting the liquid crystal display panel in the second embodiment of the present invention, the first prearranged cut lines are simultaneously formed on the front and rear surfaces of the mother substrates through the first scribing unit having the plurality pairs of first heads, the mother substrates are rotated by 90°, and then the second prearranged cut lines are simultaneously formed on the front and rear surfaces of the mother substrates through the second scribing unit having the plurality pairs of second heads. Thus, without having to rotate or reverse the mother substrates, the first and second prearranged cut lines can be formed on the front and rear surfaces of the mother substrates.

In addition, steam is simultaneously sprayed on the first and second prearranged cut lines formed on the front and rear surfaces of the mother substrates to crack the substrate along the first and second prearranged cut lines in order to separate the liquid crystal display panels. This shortens the time required for cutting the liquid crystal display panels.

In particular, in the method for cutting the liquid crystal display panel in accordance with the second embodiment of the present invention, the X scribing and Y scribing are performed simultaneously in different scribing parts and each scribing unit has the plurality of heads, whereby the first and second prearranged cut lines can be formed through the total two times of scribing process. Thus, compared with the cutting process in the first embodiment of the present invention, a tag time can be shortened and accuracy of the scribing process can be enhanced.

According to the method for cutting the liquid crystal display panel according to the present invention, because the liquid crystal display panels are cut by spraying steam along the first and second prearranged cut lines formed on the mother substrates, the generation of glass chips can be prevented, and thus, degradation of picture quality of driving deficiency of an LCD device due to adsorption of the glass chips can be prevented. In addition, because the generation of the glass chips is prevented, an operator can be prevented from having respiratory ailments due to the glass chips.

In addition, according to the method for cutting the liquid crystal display panel according to the present invention, because a waiting time of the mother substrates in the scribing unit is shortened, the cracking can be made stably, so that defect that may be generated as a value set according to the mother substrates and each scribe line is changed frequently can be prevented.

Figure 6:
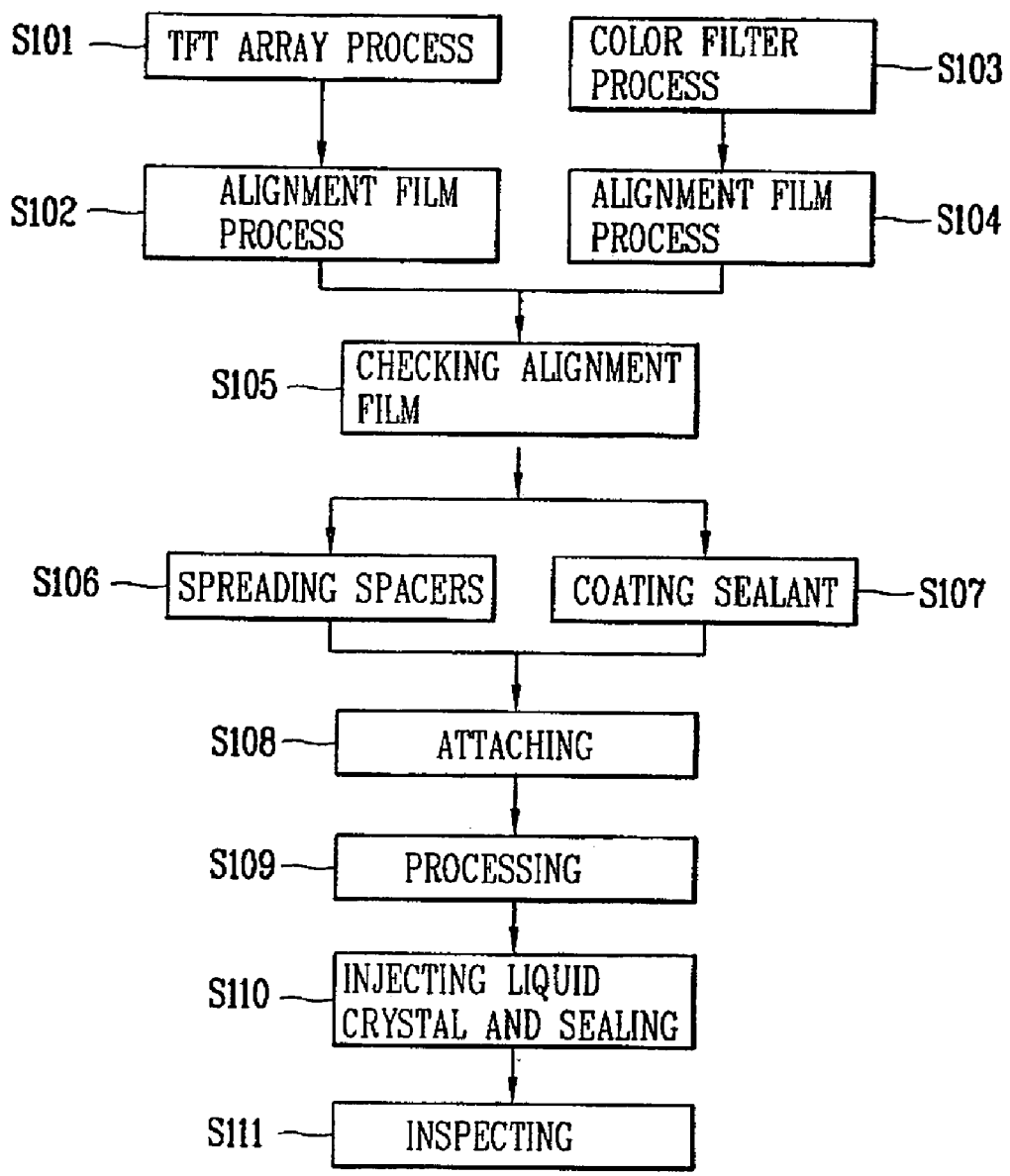
FIG. 6 is a flow chart illustrating the sequential processes of one method for fabricating a liquid crystal display panel in accordance with the present invention.
Figure 7:
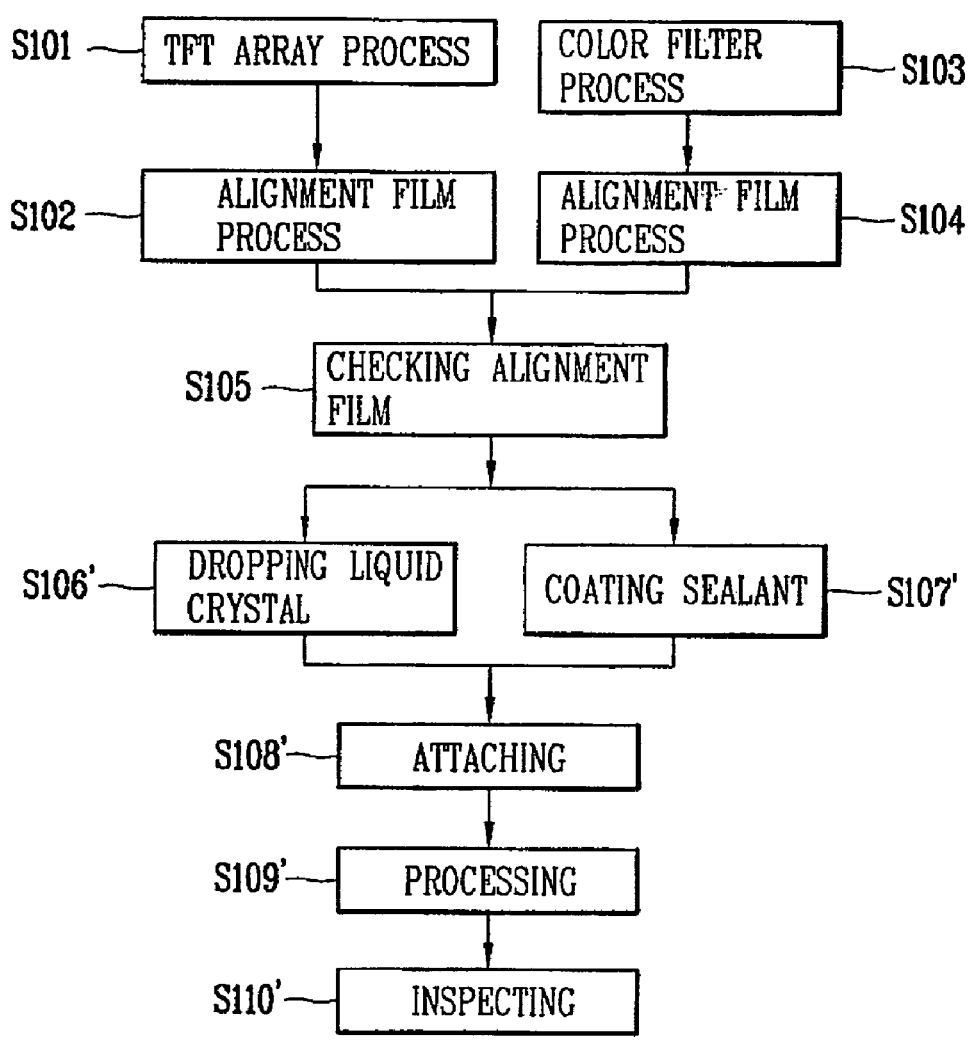
FIG. 7 is a flow chart illustrating the sequential processes of another method for fabricating a liquid crystal display panel in accordance with the present invention.

FIG. 6 is a flow chart illustrating the processes of one method for fabricating a liquid crystal display panel in accordance with the present invention, and FIG. 7 is a flow chart illustrating the processes of another method for fabricating a liquid crystal display panel in accordance with the present invention.

Specifically, FIG. 6 illustrates a method for fabricating an LCD in which a liquid crystal layer is formed by a liquid crystal injection method, and FIG. 7 illustrates a method for fabricating an LCD in which a liquid crystal layer is formed by a liquid crystal dropping method.

The process for fabricating the liquid crystal display panel can be divided into a driving device array process for forming a driving device on the lower array substrates, a color filter process for forming a color filter on the upper color filter substrate, and a cell process for attaching the array substrate and the color filter substrate.

To begin with, a plurality of gate lines and a plurality of data lines arranged to define pixel regions on the lower substrate are formed and a TFT switching device is formed to be connected with the gate lines and the data lines at each of the pixel regions through the array process (step S101). In addition, a pixel electrode which is connected with the TFT and drives the liquid crystal layer as a signal is applied thereto through the TFT is formed through the array process.

A color filter layer comprising red, green and blue sub-color filters implementing color and a common electrode are formed on the upper substrate through the color filter process (step S103).

Subsequently, after an alignment film is printed on the upper and lower substrates, it is aligned to provide an anchoring force or a surface fixing force (namely, a pretilt angle and an alignment direction) to liquid crystal molecules of a liquid crystal layer formed between the upper and lower substrates (step S102 and S104).

After the rubbing process is finished, the upper and lower substrates are inspected as to whether its alignment films are defective or not through an alignment film inspecting device (step S105).

The liquid crystal display panel uses the electro-optic effects of liquid crystal, and because the electric optical effect is determined by the anisotropy of the liquid crystal itself and a state of arrangement of liquid crystal molecules, controlling of the arrangement of liquid crystal molecules has much influence on stabilization of a display quality of the liquid crystal display panel.

Accordingly, the alignment film forming process for effectively aligning liquid crystal molecules is of much importance with respect to characteristics of picture quality in the liquid crystal cell process.

A method for inspecting the rubbing deficiency includes a first inspecting process which determines whether the coated alignment film has a blur, a strip or a pin hole on its surface or not, and a second inspecting process in which uniformity of the surface of the rubbed alignment film is checked and determines whether the surface of the rubbed alignment film has a scratch or not.

After the inspecting of the alignment film is finished, as illustrated in FIG. 6, spacers for uniformly maintaining a cell gap are formed on the lower substrate and a sealant is coated on an outer edge of the upper substrate. And then, the lower and upper substrates are attached by applying a pressure thereto (steps S106~S108). In this case, the spacers can be ball spacers according to a spreading method, or can be columnar spacers formed through patterning.

The lower and upper substrates are formed as large-scale glass substrates. In other words, a plurality of panel regions are formed on the large-scale glass substrates, and the TFT, the driving device, and the color filter layer are formed at each panel region. Thus, in order to obtain a unit liquid crystal display panel, the glass substrates are to be cut and processed (step S109).

In this case, in order to separate the mother substrates into individual liquid crystal panels, the method for cutting a liquid crystal display panel in accordance with the present invention is used, which will now be described in detail with reference to FIG. 8.

Figure 8:
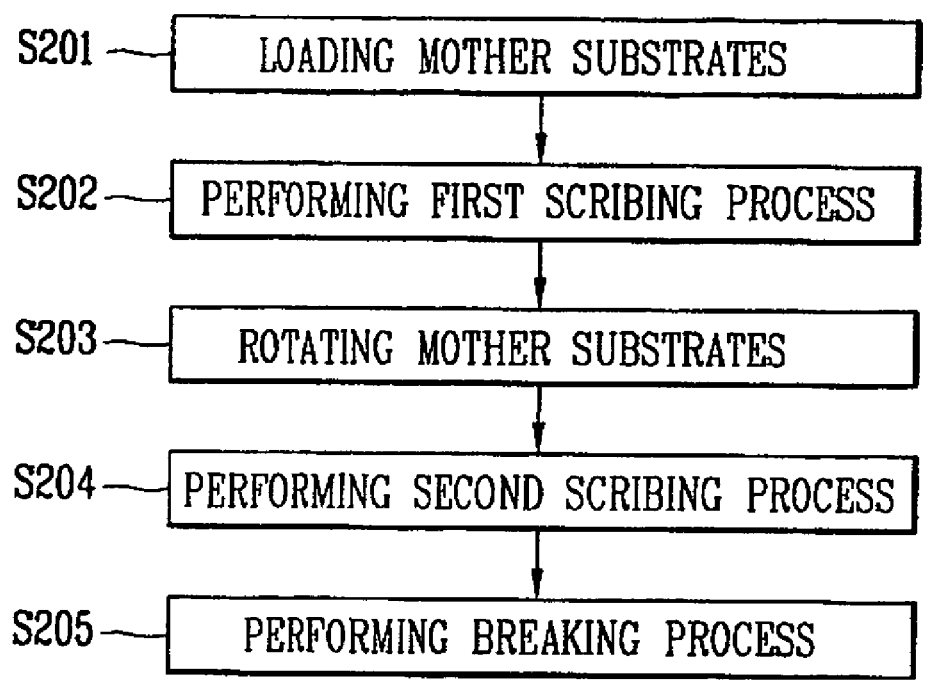
FIG. 8 is a flow chart illustrating the sequential processes of a method for cutting a liquid crystal display panel in accordance with the present invention in FIGS. 6 and 7.

FIG. 8 is a flow chart illustrating the sequential processes of a method for cutting a liquid crystal display panel in accordance with the present invention in FIGS. 6 and 7.

First, the pair of attached mother substrates on which the pluralities of panel regions have been formed are loaded and transferred to the first scribing part through the transfer unit (step S201). In this case, the TFTs, driving elements, and the color filter substrates have been formed on the upper and lower panels.

After being transferred to the first scribing part, the first prearranged cut lines are formed to section the panel regions on the front and rear surfaces of the mother substrates through a first scribing unit having the plurality pairs of first heads.

In this manner, the first prearranged cut lines are formed in the first direction on the mother substrates through the plurality of first heads by performing the first scribing process one time (step S202).

After the first scribing process in the first direction is finished, the mother substrates are rotated by 90° and then transferred to the second scribing part. In this case, the mother substrates themselves can be rotated by 90° or the stage on which the mother substrates have been loaded can be rotated by 90° (step S203).

Thereafter, the second prearranged cut lines are formed to section the panel regions on the front and rear substrates of the mother substrates in the first direction through the plurality pairs of second heads provided in a second scribing unit. In this manner, the second prearranged second cut lines are formed in the first direction on the mother substrates through the plurality pairs of second heads by performing the second scribing process one time (step S204).

After the scribing process is finished in the first and second directions, the mother substrates are moved to the breaking part, in which steam is sprayed on the mother substrates through the steam break and the air knife is disposed on the front and rear substrates of the mother substrates to thereby cut the mother substrates along the prearranged cut lines to individually separate them (step S205).

Thereafter, as illustrated in FIG. 6, liquid crystal is injected through a liquid crystal injection opening of each unit liquid crystal display panel, the liquid crystal injection opening is sealed to form a liquid crystal layer, and then, each unit liquid crystal display panel is inspected, thereby finishing fabrication of each of the unit liquid crystal display panels (steps S110 and S111).

The liquid crystal is injected by using a vacuum injection method using a pressure difference. That is, according to the vacuum injection method, the liquid crystal injection opening of the unit liquid crystal display panel separated from the large-scale mother substrates is put in a container filled with liquid crystal in a chamber with a certain degree of vacuum, and then, the degree of vacuum is changed to allow liquid crystal to be injected into the liquid crystal display panel according to a pressure difference between the interior and the exterior of the liquid crystal display panel. When the liquid crystal is filled inside the liquid crystal display panel, the liquid crystal injection opening is sealed to form the liquid crystal layer of the liquid crystal display panel. Thus, in order to form the liquid crystal layer at the liquid crystal display panel through the vacuum injection method, a portion of a seal pattern needs to be opened to serve as the liquid crystal injection opening.

However, the vacuum injection method has the following problem.

That is, first, it takes much time to fill the liquid crystal in the liquid crystal display panel. In general, since the attached liquid crystal display panel has an area of hundreds of $cm^2$ and a gap of merely about a few μm, the amount of injected liquid crystal per unit hour is inevitably small when the vacuum injection method using the pressure difference is employed. For example, about 8 hours are required for filling liquid crystal for fabricating an about 15-inch liquid crystal display panel. That is, since that much time is required for fabrication of the liquid crystal display panel, the productivity is degraded. In addition, as the liquid crystal display panel is increased in size, time taken for filling liquid crystal would be more lengthened and a defective filling of liquid crystal would also occur, resulting in that it cannot cope with the enlargement of the liquid crystal display panel.

Second, a large amount of liquid crystal is used. In general, the amount of liquid crystal actually injected into the liquid crystal display panel is quite small compared with the amount of liquid crystal filled in the container, and when liquid crystal is exposed in the air or exposed to a specific gas, it is reacted to the gas and degraded. Thus, although the liquid crystal filled in the container is filled in the plurality of unit liquid crystal display panels, a large amount of liquid crystal remaining after finishing the filling is discarded, and accordingly, the unit cost of the liquid crystal panel is increased only to weaken price competitiveness of the product.

In order to solve the problem of the vacuum injection method, recently, the dropping method is increasingly employed.

As illustrated in FIG. 7, in case of using the dropping method, after the alignment film is inspected (step S105), a certain seal pattern is formed with a sealant on the color filter substrate and, at the same time, a liquid crystal layer is formed on the array substrate (steps S106' and S107').

According to the dropping method, after liquid crystal is dropped and dispensed on the large-scale first mother substrate where a plurality of array substrates are disposed or on an image display region of the second mother substrate where the plurality of color filter substrates are disposed, the first and second mother substrates are attached by applying a certain pressure thereto to thereby make the liquid crystal uniformly distributed to the entire image display region and thus form a liquid crystal layer.

Thus, in the case where the liquid crystal layer is formed in the liquid crystal display panel through the dropping method, the seal pattern must be formed as a closed pattern surrounding the outer edge of the pixel part region in order to prevent a leakage of liquid crystal to outside of the image display region.

The dropping method allows dropping of liquid crystal within a relatively short time compared with the vacuum injection method and can quickly form the liquid crystal even when the liquid crystal display panel is large.

In addition, since the only required amount of liquid crystal is dropped on the substrate, such an increase in the unit cost of the liquid crystal display panel according to discarding of the high-priced liquid crystal as in the vacuum injection method can be prevented, and thus, the price competitiveness of the product can be enhanced.

Thereafter, in a state that the upper and lower substrates on which liquid crystal has been dropped and the sealant has been coated are aligned, a pressure is applied thereto to make the lower and upper substrate attached by the sealant and simultaneously the dropped liquid crystal spread uniformly on the entire portion of the panel (step S108').

Through the process, the plurality of liquid crystal display panels with the liquid crystal layer formed thereon are formed on the large-scale glass substrates (upper and lower substrates). The glass substrates are processed and cut to be separated into the plurality of liquid crystal display panels, which are then inspected to thereby finish fabrication of the liquid crystal display panel (steps S109' and S110').

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for cutting a liquid crystal display panel comprising:
    transferring a pair of attached mother substrates having a plurality of panel regions arranged thereon to a first scribing part;
    forming first prearranged cut lines for sectioning the panel regions in a first direction on front and rear surfaces of the mother substrates through a first scribing unit having a plurality of first heads;
    forming second prearranged cut lines for sectioning the panel regions in a second direction on the front and rear surfaces of the mother substrates through a second scribing unit having a plurality of second heads; and
    transferring the mother substrates with the first and second prearranged first and second cut lines formed thereon to a breaking part and separating them into a plurality of unit liquid crystal display panels.

2. The method of claim 1, further comprising:
    rotating the mother substrates by 90° and transferring it to the second scribing part.

3. The method of claim 1, wherein the second direction is substantially the same direction as the first direction.

4. The method of claim 1, wherein the second direction is substantially perpendicular to the first direction.

5. The method of claim 1, wherein the mother substrates are transferred by a transfer unit.

6. The method of claim 5, wherein the transfer unit comprises a plurality of conveyer belts.

7. The method of claim 5, wherein the transfer unit comprises a plurality of transfer rollers.

8. The method of claim 5, wherein the transfer unit comprises a first conveyor part formed as a conveyer belt and a second conveyor part formed as a transfer roller.

9. The method of claim 1, wherein the plurality of first heads form the first prearranged cut lines on the mother substrates through one time of first scribing process.

10. The method of claim 1, wherein the plurality of second heads form the second prearranged cut lines on the mother substrates through one time of second scribing process.

11. The method of claim 1, wherein a distance between the first and second heads is controlled according to a size of panel regions disposed on the mother substrates.

12. The method of claim 1, wherein the first and second prearranged cut lines are substantially cross vertically.

13. The method of claim 1, wherein the first scribing unit includes the plurality of first heads at its upper and lower portions so that it can simultaneously form the first prearranged cut lines on the front and rear surfaces of the mother substrates.

14. The method of claim 1, wherein the second scribing unit includes the plurality of second heads at its upper and lower portions so that it can simultaneously form the second prearranged cut lines on the front and rear surfaces of the mother substrates.

15. The method of claim 1, wherein the mother substrates are separated along the first and second prearranged cut lines by spraying steam through steam breaks disposed at front and rear surfaces of the mother substrates.

16. The method of claim 15, wherein moisture and glass chips remaining on the surfaces of the mother substrates are removed by spraying dried air through an air knife installed at rear surfaces of the steam breaks.

17. A method for fabricating a liquid crystal display panel comprising:
    providing mother substrates divided into a plurality of panel regions;

performing an array process on the mother substrate for an array substrate and performing a color filter process on the mother substrate for a color filter substrate;

forming an alignment film on the surface of the mother substrates;

performing rubbing on the alignment film-formed mother substrates;

attaching the pair of rubbing-finished mother substrates;

forming first prearranged cut lines for sectioning the panel regions in a first direction on front and rear surfaces of the attached mother substrates by using a first scribe unit having a plurality of first heads;

forming second prearranged cut lines for sectioning the panel regions in a second direction on the front and rear surfaces of the mother substrates through a second scribing unit having a plurality of second heads; and separating the mother substrates with the first and second prearranged first and second cut lines formed thereon into a plurality of unit liquid crystal display panels.

18. The method of claim 17, further comprising:

rotating the mother substrates by 90° and transferring it to the second scribing unit.

19. The method of claim 17, wherein the second direction is substantially the same direction as the first direction.

20. The method of claim 17, wherein the second direction is substantially perpendicular to the first direction.

21. The method of claim 17, wherein the panel regions on the upper portion of the attached mother substrates is an array substrate on which TFTs have been formed through the array process and the panel regions on the lower portion of the mother substrates is a color filter substrate on which color filters have been formed through the color filter process.

22. The method of claim 17, wherein the plurality of first heads form the first prearranged cut lines on the mother substrates through one time of first scribing process.

23. The method of claim 17, wherein the plurality of second heads form the second prearranged cut lines on the mother substrates through one time of second scribing process.

24. The method of claim 17, wherein a distance between the first and second heads is controlled according to a size of panel regions disposed on the mother substrates.

25. The method of claim 17, wherein the first and second prearranged cut lines are substantially cross vertically.

26. The method of claim 17, wherein the first scribing unit includes the plurality of first heads at its upper and lower portions so that it can simultaneously form the first prearranged cut lines on the front and rear surfaces of the mother substrates.

27. The method of claim 17, wherein the second scribing unit includes the plurality of second heads at its upper and lower portions so that it can-simultaneously form the second prearranged cut lines on the front and rear surfaces of the mother substrates.

28. The method of claim 17, wherein the mother substrates are separated along the first and second prearranged cut lines by spraying steam through steam breaks disposed at front and rear surfaces of the mother substrates.

29. The method of claim 28, wherein moisture and glass chips remaining on the surfaces of the mother substrates are removed by spraying dried air through air-knifes installed at rear surfaces of the steam breaks.

30. The method of claim 28, wherein the temperature of steam is within the range of about 100° C. to 250° C.

31. The method of claim 17, wherein liquid crystal is dropped to one of the rubbing process-finished mother substrate for the array substrate and the mother substrate for the color filter substrate, and a sealant is coated on the other mother substrate.

32. The method of claim 31, wherein the liquid crystal-dropped mother substrate and the sealant-coated mother substrate are attached.

33. The method of claim 17, wherein spacers are formed on one of the rubbing process-finished mother substrate for the array substrate and the mother substrate for the color filter substrate, and the sealant is coated on the other mother substrate.

34. The method of claim 33, wherein the spacer-formed mother substrate and the sealant-coated mother substrate are attached.

35. The method of claim 34, wherein the attached mother substrates are cut into a plurality of liquid crystal display panels, and then, liquid crystal is injected to each of the liquid crystal display panels.

\* \* \* \* \*